US012782449B2

(12) United States Patent
Chae et al.

(10) Patent No.: US 12,782,449 B2
(45) Date of Patent: Nov. 3, 2026

(54) BATTERY MONITORING METHOD AND DEVICE

(71) Applicant: SMART ELECTRONICS INC., Ulju-gun (KR)

(72) Inventors: Hong Il Chae, Gyeongsan-si (KR); Hyun Chang Kim, Ulju-gun (KR); Kwang Hoon Lee, Yangsan-si (KR); Won Seok Kim, Yeonje-gu (KR); Hyuk Jae Kwon, Yangsan-si (KR); Young Min Son, Dong-gu (KR); Hyeon Chang Jeong, Dongnae-gu (KR)

(73) Assignee: Smart Electronics Inc., Ulju-gun (KR)

( * ) Notice: Subject to any disclaimer, the term of this patent is extended or adjusted under 35 U.S.C. 154(b) by 367 days.

(21) Appl. No.: 18/505,509

(22) Filed: Nov. 9, 2023

(65) Prior Publication Data

US 2024/0159837 A1 May 16, 2024

(30) Foreign Application Priority Data

Nov. 10, 2022 (KR) ........................ 10-2022-0149909

(51) Int. Cl.
*G01R 31/3842* (2019.01)
*G01R 31/374* (2019.01)
(Continued)

(52) U.S. Cl.
CPC ....... *G01R 31/3842* (2019.01); *G01R 31/374* (2019.01); *H01M 10/486* (2013.01); *H01M 50/505* (2021.01); *H01M 50/569* (2021.01)

(58) Field of Classification Search
CPC ......................... G01R 31/3842; G01R 31/374; G01R 31/364; G01R 31/367; G01R 1/203;
(Continued)

(56) References Cited

U.S. PATENT DOCUMENTS 10,802,049 B2 10/2020 Jaedong et al.
2019/0004094 A1* 1/2019 Park ...................... H01M 10/48
(Continued)

FOREIGN PATENT DOCUMENTS

CN 106053915 * 10/2016 ............. G01R 19/32
CN 106662603 A 5/2017
(Continued)

OTHER PUBLICATIONS

TI Designs; Automotive shutn-based +/− A precision current sensing reference design; Feb. 2017; 37 pages (Year: 2017).
(Continued)

*Primary Examiner* — Alexander Satanovsky
(74) *Attorney, Agent, or Firm* — Whitaker Chalk Swindle & Schwartz PLLC; Bradley J. Birchfield

(57) ABSTRACT

The present invention provides a battery monitoring method, which is performed by a battery monitoring device, including: measuring a first voltage drop across both ends of a first shunt resistor of a bus bar electrically connected to a battery and a second voltage drop across both ends of a second shunt resistor, which is in parallel or serial connection with the first shunt resistor; calculating a first current and a second current flowing, respectively, through the first shunt resistor and the second shunt resistor using a first voltage drop value and a second voltage drop value; and determining a state of the battery using a difference between a first current value and a second current value. According to the present invention, it is possible to increase the reliability of monitoring information related to the battery's state by utilizing current values that have undergone linearity compensation and temperature compensation.

5 Claims, 14 Drawing Sheets

(51) Int. Cl.

| | |
|---|---|
| ***H01M 10/48*** | (2006.01) |
| ***H01M 50/505*** | (2021.01) |
| ***H01M 50/569*** | (2021.01) |

(58) Field of Classification Search

CPC .......................... G01R 31/388; G01R 31/3644; G01R 31/389; G01R 31/392; H01M 10/486; H01M 50/505; H01M 50/569; H01M 10/48; Y02E 60/10

See application file for complete search history.

(56) References Cited

U.S. PATENT DOCUMENTS

| | | | | |
|---|---|---|---|---|
| 2020/0300919 | A1 | 9/2020 | Song | |
| 2021/0141020 | A1 | 5/2021 | Maximilian et al. | |
| 2021/0263079 | A1* | 8/2021 | Schwarzberger | .... G01R 15/207 |

FOREIGN PATENT DOCUMENTS

| | | | | | |
|---|---|---|---|---|---|
| CN | 107861069 | A | | 3/2018 | |
| CN | 110161415 | A | | 8/2019 | |
| CN | 106053915 | B | | 7/2020 | |
| DE | 102009044992 | A1 | | 4/2011 | |
| EP | 4047378 | | * | 8/2022 | ............. G01R 19/32 |
| EP | 4047378 | A1 | | 8/2022 | |
| JP | 2013174555 | A | | 9/2013 | |
| JP | 2014016297 | A | | 1/2014 | |
| JP | 2016077135 | A | | 3/2016 | |
| JP | 2017049229 | A | | 3/2017 | |
| JP | 2017096628 | A | | 6/2017 | |
| JP | 2019015538 | | * | 1/2019 | ............. G01R 15/00 |
| JP | 2019015538 | A | | 1/2019 | |
| JP | 2019059268 | A | | 4/2019 | |
| JP | 2019109161 | A | | 7/2019 | |
| JP | 2019110712 | | * | 7/2019 | ................ H02J 7/34 |
| JP | 2019133801 | A | | 8/2019 | |
| JP | 2021009103 | A | | 1/2021 | |
| KR | 101049052 | B1 | | 7/2011 | |
| KR | 101296838 | B1 | | 8/2013 | |
| KR | 101299904 | B1 | | 9/2013 | |
| KR | 20130124881 | A | | 11/2013 | |
| KR | 101862454 | B1 | | 5/2018 | |
| KR | 10998091 | B1 | | 7/2019 | |
| KR | 101998091 | B1 | | 7/2019 | |
| KR | 20210093767 | | * | 7/2021 | ............. H01C 17/00 |
| WO | 2016047010 | A1 | | 4/2017 | |
| WO | 2021162077 | A1 | | 8/2021 | |

OTHER PUBLICATIONS

Office Action issued by Taiwanese Patent Office dated Jun. 13, 2024 in counterpart Taiwanese patent application.

EP 23209095 European Search Report; mailed Mar. 24, 2024, 69 pages (Year: 2024).

* cited by examiner

| | BEFORE APPLYING ALGORITHM | AFTER APPLYING ALGORITHM |
|---|---|---|
| ACCURACY | -0.03%~0.05% | -0.01%~0.01% |
| LINEARITY | 0.08% | 0.02% |

FIG. 14

BATTERY MONITORING METHOD AND DEVICE

CROSS-REFERENCE TO RELATED APPLICATION(S)

This application claims the benefit under 35 USC § 119(a) of Korean Patent Application No. 10-2022-0149909, filed on Nov. 10, 2022, in the Korean Intellectual Property Office, the entire disclosure of which is incorporated herein by reference for all purposes.

BACKGROUND

1. Field

The present invention relates to a battery monitoring method and device, and more specifically, to a method and device for measuring current input and output from a battery using a shunt resistor and using this measurement to monitor the state of the battery.

2. Description of Related Art

A shunt resistor refers to a resistor with a very low resistance value that is primarily used to measure current. Current measurement using a shunt resistor, as compared to using a Hall sensor that utilizes the magnetic field generated when current flows through a wire, is characterized by its ability to measure current with high precision at a low cost.

An ammeter equipped with a coil can include a shunt resistor connected in parallel internally. In contrast, an ammeter connected in series to a terminal formed by cutting the wire can measure the current flowing through the wire using the intensity of the magnetic field formed in the coil and the current value flowing through the shunt resistor.

When a shunt resistor is integrated into the middle of a wire, the voltage formed at both ends of the shunt resistor is measured, and a current value can be calculated from the measured voltage using Ohm's law.

The current flowing through terminals connected to a battery, such as in the case of battery discharge or charging, serves as an indicator for calculating the remaining capacity or charge capacity of the battery. Therefore, precise current measurement is required.

For stable current sensing in batteries, for example, electric vehicle batteries, redundancy is achieved by using two or more resistors based on the concept of redundancy. However, if there is a significant difference in the measured current values used for redundancy verification, it may pose problems in determining the state of the battery. Additionally, as the conduction-time of the current and the current value increase, the battery's temperature rises, and the error range also increases. This requires the measurement of current values that accurately represent the actual chemical state of the battery.

SUMMARY

The present disclosure achieves technical advantages as a battery monitoring method and device. The present disclosure provides for a system integrated into a practical application with meaningful limitations that may include a method and device for measuring current input and output from a battery using a shunt resistor and using this measurement to monitor the state of the battery.

One object of the present invention is to provide a current measurement method and device for measuring the current flowing in a bus bar through a shunt resistor.

Another object of the present invention is to provide a current measurement method and device capable of reducing measurement error through linearity compensation and temperature compensation.

Still another object of the present invention is to provide a current measurement method and device capable of performing temperature compensation for current measurement values by predicting the temperature of a bus bar in a high temperature state.

Objects of the present invention should not be limited to the above objects and other unmentioned objects will be clearly understood by those skilled in the art from the following description.

In one embodiment of the present invention, a dual configuration, i.e., redundancy design, is a battery monitoring device that uses a shunt resistor with two resistance values on a single bus bar and has two independent analog-to-digital converters (ADCs). The purpose of the battery monitoring device is to detect rapidly changing currents, compare two current values, and transmit a warning message to an upper system when the error between these two current values exceeds a preset value. The number of shunt resistors is not limited to two, and the technical concept of the present invention may also be applied when a single bus bar includes a plurality of shunt resistors.

The battery monitoring device includes an isolated voltage converter to be used in high-voltage applications and is characterized by including a digital isolated converter for communications.

The two shunt resistors can be changed to various ratios of 1:1, 2:1, 0.75:1, etc. as needed to allow for verification of not only optimal current measurement but also the current value within the current sensor itself. Additionally, when necessary, one shunt resistor may be combined with other measurement methods, such as Hall sensors, magnetic resistance sensors, and the like, and this combination provides the advantage of independent verification of relevant values within the current sensor.

Conventionally, when switching is performed using a single analog-to-digital converter, it is difficult to simultaneously measure rapidly changing current values, and the verification of current values has issues related to the time difference in current measurements, causing unnecessary diagnostics even when the actual current values are the same.

To address these issues, two independent analog-to-digital converters (ADCs) are used, and a compensation algorithm is separately employed to ensure their independence. The measurement times are synchronized to enhance the verification function of the current values. The number of ADCs is not limited to simply two. Since shunt resistors are sensitive to temperature, a temperature sensor must be used. However, the temperature sensor is incapable of measuring the actual temperature of the shunt resistor that has risen due to high current. Therefore, a temperature prediction algorithm is needed. This temperature prediction algorithm predicts the temperature based on factors such as the magnitude of current, conduction time of current, external temperature, and shunt resistance value.

A synchronization algorithm uses a low-speed converter to obtain a measured value and then compares it with a high-speed converter value. When the output of the measured value matches the high-speed value, the current value may be determined as a high-speed current value, and current value can be verified.

Additionally, the battery monitoring device is characterized by rolling count (RC) and cyclic redundancy check (CRC) for detection of common omissions and errors.

In order to achieve the objects of the present invention, according to an embodiment of the present invention, there is provided a battery monitoring method, which is performed by a battery monitoring device, including: measuring a first voltage drop across both ends of a first shunt resistor of a bus bar electrically connected to a battery and a second voltage drop across both ends of a second shunt resistor, which is in parallel or serial connection with the first shunt resistor; calculating a first current and a second current flowing, respectively, through the first shunt resistor and the second shunt resistor using a first voltage drop value and a second voltage drop value; and determining a state of the battery using a difference between a first current value and a second current value.

In addition, in the battery monitoring method, the calculating of the first current and the second current may include: converting the first voltage drop value and the second voltage drop value into digital values; calculating the first current value and the second current value by applying calibration data for the first shunt resistor and calibration data for the second shunt resistor to the first voltage drop value and the second voltage drop value, respectively; and amplifying the first current value and the second current value.

Additionally, the battery monitoring method may further include measuring a temperature due to current using a temperature sensor.

In addition, in the battery monitoring method, the temperature sensor may include an internal temperature sensor configured to measure a first temperature value of the bus bar and an external temperature sensor configured to measure a second temperature value of a printed circuit board (PCB) where the bus bar is installed, and the measuring of the temperature may include applying a weight to each of the first temperature value and the second temperature value.

Further, the battery monitoring method may further include performing linearity compensation for the first current value and the second current value using linearity data that includes a temperature value, inflection point information of the first current value and the second current value, amplification values of the first current value and the second current value, and a temperature prediction rise value due to current.

In addition, the battery monitoring method is characterized in that the performing of the linearity compensation includes compensating for linearity for each current segment based on an inflection point according to an amplification factor of the first current and the second current.

Additionally, the battery monitoring method may further include performing synchronization and temperature compensation for the first and second current values that change rapidly according to changes in temperature.

In addition, in the battery monitoring method, the performing of the synchronization and temperature compensation may include determining a temperature prediction variable according to the magnitudes of the first and second current values and the current application time; calculating a temperature prediction variable value based on the temperature prediction variable; and performing temperature compensation for the first current value and the second current value using the temperature prediction variable value.

In order to achieve the above object, according to an embodiment of the present invention, there is provided a battery monitoring device including a voltage measurement unit configured to measure a first voltage drop across both ends of a first shunt resistor of a bus bar electrically connected to a battery and a second voltage drop across both ends of a second shunt resistor, which is in parallel or serial connection with the first shunt resistor; a current calculation unit configured to calculate a first current and a second current flowing, respectively, through the first shunt resistor and the second shunt resistor using a first voltage drop value and a second voltage drop value; a temperature measurement unit configured to measure a temperature change due to the first current and the second current by using a temperature sensor; and a control unit configured to determining a state of the battery using a difference between a first current value and a second current value, calculated through linearity compensation due to device characteristics, synchronization, and temperature compensation for the first and second current values.

In addition, the battery monitoring device may further include a linearity compensation unit configured to compensate for linearity for each current segment based on an inflection point according to an amplification factor of the first current and the second current.

In addition, the battery monitoring device may further include a temperature compensation unit configured to determine a temperature prediction variable according to the magnitudes of the first and second current values and current application time and perform temperature compensation for the first current value and the second current value using a temperature prediction variable value calculated based on the temperature prediction variable.

In addition, the battery monitoring device may further include a battery state determination unit configured to determine an error according to a range of a difference value and diagnose a state of the battery according to the number of occurrences of the error.

The details of other embodiments are incorporated in “DETAILED DESCRIPTION OF THE INVENTION” and accompanying “Drawings”.

The advantages and/or features, and schemes of achieving the advantages and features of the present invention will be apparently comprehended by those skilled in the art based on the embodiments, which are detailed later in detail, together with accompanying drawings.

This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The present invention is only defined within the scope of accompanying claims.

According to the present invention, it is possible to reduce the measurement error of the current value through linearity compensation and temperature compensation.

Additionally, utilizing current values that have undergone linearity compensation and temperature compensation may increase the reliability of monitoring information related to the battery’s state.

The effects that can be obtained from the battery monitoring method and device according to the technical concept of the present invention are not limited to the effects mentioned above, and other effects not mentioned are expected to be clearly understood by those skilled in the art to which the present invention pertains from the following description.

BRIEF DESCRIPTION OF THE DRAWINGS

FIG. 14 is a table showing an example of the accuracy and linearity resulting from compensation according to an embodiment of the present invention.

Figure 1:
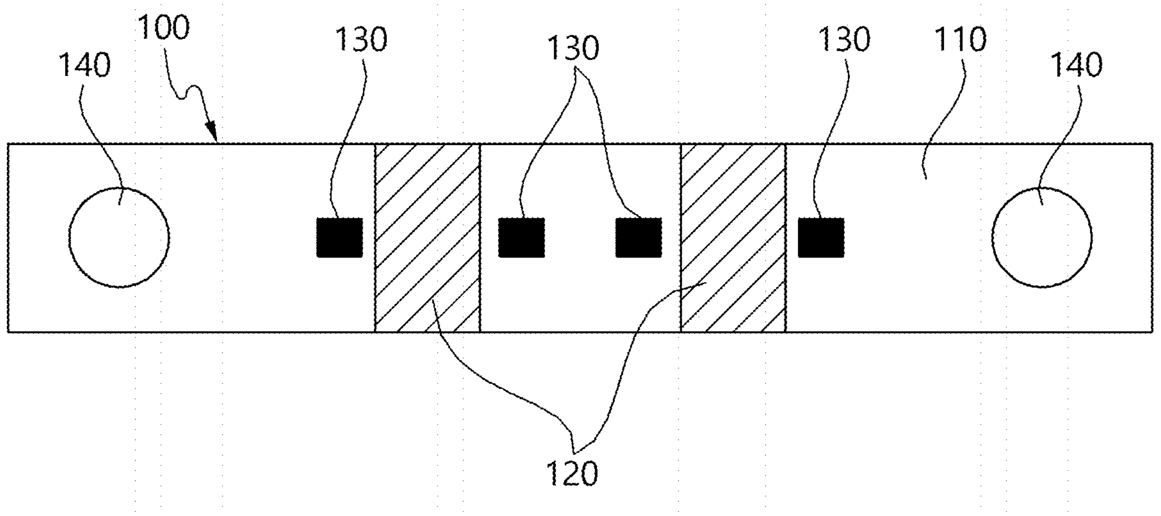
FIG. 1 is a schematic diagram illustrating a bus bar included in a battery monitoring device according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Before describing the present invention in detail, terms and words used herein should not be construed in an ordinary or dictionary sense and should not be construed as limiting the invention to the inventors of the present invention in the best way possible, and it is to be understood that the concepts of various terms can be properly defined and used, and further, these terms and words should be construed as meaning and concept consistent with the technical idea of the present invention.

That is, the terms used herein are used only to describe preferred embodiments of the present invention, and are not intended to specifically limit the contents of the present invention, and it should be noted that this is a defined term considering that many possibilities of the present invention.

Also, in this specification, the singular forms "a", "an", and "the" include plural referents unless the context clearly dictates otherwise, and similarly it should be understood that even if they are expressed in plural they may include singular meaning.

Where an element is referred to as "comprising" or "including" another element throughout this specification, unless explicitly described to the contrary, this will be understood to imply the inclusion of stated elements but not the exclusion of any other elements.

Further, when it is stated that an element is "inside or connected to another element", this element may be directly connected to another element or may be installed in contact with it, or may be installed spaced apart with a predetermined distance, and in the case where an element is installed to be spaced apart with a predetermined distance, a third element or means for fixing or connecting the element to another element may be present, and it should be noted that the description of the third element or means may be omitted.

In contrast, when an element is described as being "directly connected to" or "directly coupled to" or "directly access" another element, there are no intervening elements present.

Similarly, other words used to describe the relationship between elements should be interpreted in a like fashion (e.g., "between" versus "directly between", "adjacent" versus "directly adjacent", etc.).

In the following description, the terms of "one surface," "opposite surface," "one side," "opposite side," "first," and "second," if used, are used to clearly distinguish between one component and a different component, and the meanings of relevant components should not be limited by these terms.

Further, in the following description, terms of "on," "under," "left," and "right" related to a position, if used, should be interpreted as representing a relative position of a relevant component in a relevant drawing. In addition, unless the position is not specified as an absolute position, the terms related to the position should not be interpreted as representing the absolute position.

In addition, regarding the reference numerals assigned to the elements in the drawings, it should be noted that the same elements will be designated by the same reference numerals, wherever possible, even though they are shown in different drawings. In other words, throughout the specification, the same reference numeral is assigned to the same element.

It is to be understood that the size, position, coupling relationships and such, of each component constituting the present invention in the accompanying drawings, may be partially exaggerated or reduced or omitted to be able to sufficiently clearly convey the scope of the invention or for convenience of describing, and therefore the proportion or scale thereof may not be rigorous.

Also, in the following description of the present invention, a detailed description of a configuration that is considered to unnecessarily obscure the gist of the present invention, for example, a known technology including the prior art, may be omitted.

Hereinafter, exemplary embodiments of the present invention will be described in detail with reference to accompanying drawings.

FIG. 1 is a schematic diagram illustrating a bus bar included in a battery monitoring device according to an embodiment of the present invention.

Referring to FIG. 1, a bus bar 100 may be configured to include a conductor 110, a shunt resistor 120, a sensing pin 130, and a hole 140. The bus bar 100 may be configured in a form in which a plurality of shunt resistors 120, for example, 2 or more shunt resistors 120, and the conductor 110 are alternately connected. In this embodiment, it is described that two shunt resistors 120 are arranged, but the embodiment is not limited to this. In addition, the battery monitoring device of the present invention may be made as a module and used in various electronic devices.

Sensing pins 130 may be placed at both ends of the shunt resistor 120. The plus and minus terminals of a voltmeter may be connected to two selected sensing pins 130, respectively.

Holes 140 that can be connected to a battery and a circuit are formed at both ends of the bus bar 100. A secondary battery may be connected through the holes 140.

The bus bar 100 is not limited to a linear shape and may have other shapes, such as a "C" shape or an "S" shape, and a plurality of shunt resistors may be arranged in a series or parallel circuit.

The shunt resistor 120 may be implemented using a copper alloy, such as manganin, an alloy of copper, manganese, and nickel. The shunt resistor 120 has a relatively low resistance value, and a current value may be calculated by measuring the voltage between the sensing pins 130 at both ends of the shunt resistor 120.

Figure 2:
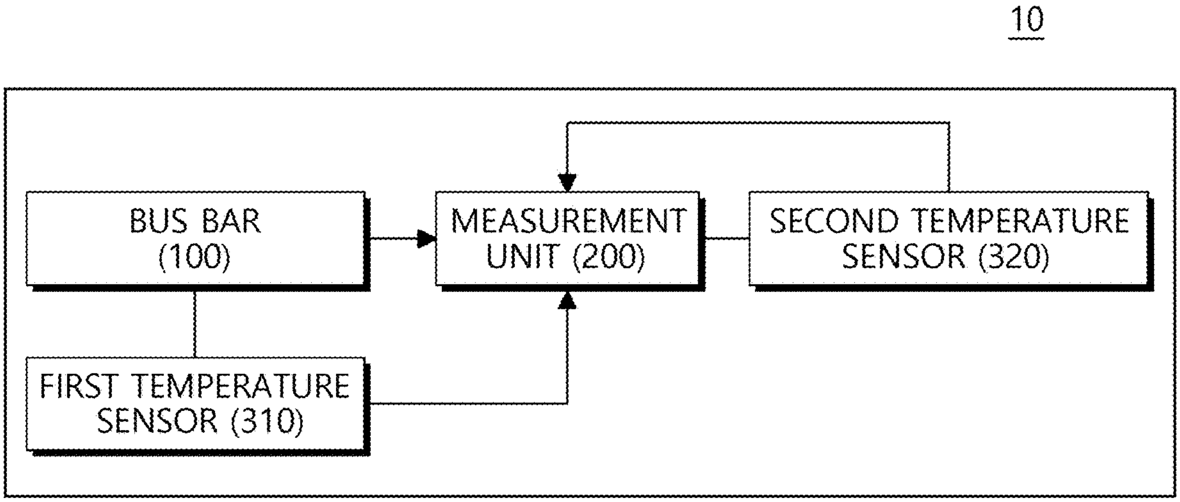
FIG. 2 is a block diagram illustrating a battery monitoring device according to an embodiment of the present invention.

FIG. 2 is a block diagram illustrating a battery monitoring device according to an embodiment of the present invention.

Referring to FIG. 2, a battery monitoring device 10 according to an embodiment of the present invention may be configured to include a bus bar 100, a measurement unit 200, a first temperature sensor 310, and a second temperature sensor 320. The measurement unit 200 may be electrically connected to sensing pins 130 placed at both ends of a shunt resistor 120 included in the bus bar 100.

The bus bar 100 has the function of creating multiple voltage drops at both ends of the shunt resistor 120 using the shunt resistors 120 connected in series or parallel. The measurement unit 200 may be electrically connected to the sensing pins 130 formed at both ends of the shunt resistor 120.

The measurement unit 200 has the functions of measuring multiple voltage drops and, based on these measurements, calculating and compensating for the current to output an accurate current value during battery discharge and charging and further has the function of monitoring the battery's state based on the current value. Battery monitoring includes predicting the battery's lifespan and state of charge (SOC), and determining whether the battery is in a normal state.

The first temperature sensor 310, also referred to as an internal sensor, may be installed on the bus bar 100 and is responsible for sensing the temperature of the bus bar 100, specifically, a first temperature value. The second temperature sensor 320, also referred to as an external sensor, may be installed on a printed circuit board (PCB) where the bus bar 100 is mounted, and is responsible for sensing the temperature of the circuit board, specifically, a second temperature value.

The measurement unit 200 is electrically connected to the first temperature sensor 310 and the second temperature sensor 320 and may receive input of the first temperature value and the second temperature value.

Figure 3:
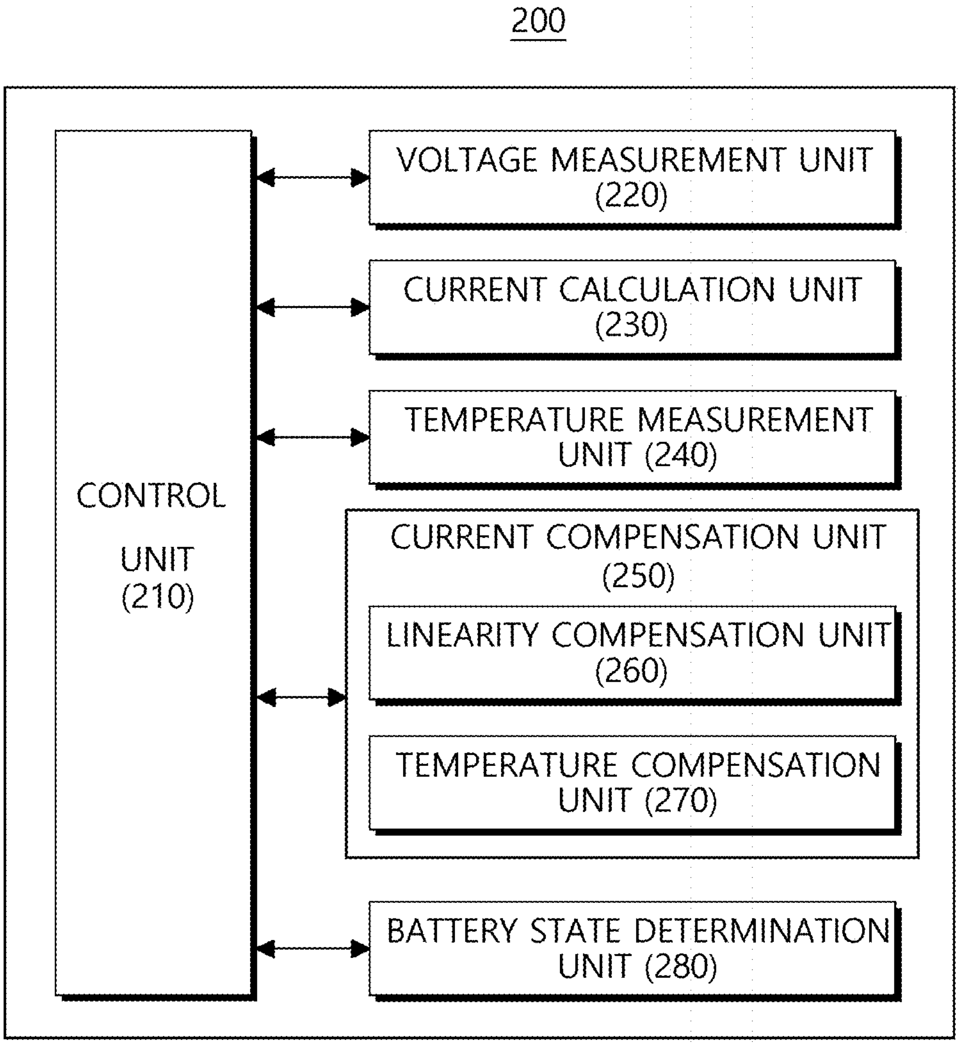
FIG. 3 is a block diagram illustrating a measurement unit included in a battery monitoring device according to an embodiment of the present invention.

FIG. 3 is a block diagram illustrating a measurement unit included in a battery monitoring device according to an embodiment of the present invention.

Referring to FIG. 3, the measurement unit 200 included in the battery monitoring device 10 according to an embodiment of the present invention may be configured to include a control unit 210, a voltage measurement unit 220, a current calculation unit 230, a temperature measurement unit 240, a current compensation unit 250, and a battery state determination unit 280.

The voltage measurement unit 220 has the function of measuring a first voltage drop across both ends of a first shunt resistor of the bus bar electrically connected to a battery and a second voltage drop across both ends of a second shunt resistor, which is in parallel or serial connection with the first shunt resistor.

The current calculation unit 230 has the function of calculating a first current and a second current flowing through the first shunt resistor and the second shunt resistor, respectively, using the values of the first and second voltage drops.

The temperature measurement unit 240 has the function of measuring the temperature change of the shunt resistor 120 due to the first current and second current, using the first temperature sensor 310 and the second temperature sensor 320. The temperature measurement unit 240 receives the first temperature value and the second temperature value from the first temperature sensor 310 and the second temperature sensor 320, respectively, converts them into digital values, and applies weights to the converted first and second temperature values to output the shunt resistor's temperature value. The shunt resistor's temperature value may be used for linear compensation and temperature compensation of current values.

The control unit 210 has the function of determining the battery's state based on the difference between the first current value and the second current value that are measured through linear compensation, synchronization, and temperature compensation by taking into account device characteristics. Before temperature compensation, the control unit 210 may compare the measurement times of the first and second voltage drop values. If the measurement times are different, the control unit may control the voltage measurement unit 220 to synchronize the measurement times based on one of the measurement times.

A linearity compensation unit 260 has the function of compensating for linearity for each current segment based on an inflection point according to the amplification factor of the first current and the second current. For example, the first current value may include errors when compared to an ideal value, and the error ratio may appear discontinuously on the graph due to non-linearity of the device. If linearity compensation is applied to such an error ratio, the error ratio may be continuously distributed.

The temperature compensation unit 270 has the function of determining a temperature prediction variable based on the magnitudes of the first current value and the second current value, as well as current application time, and performing temperature compensation for the first current value and the second current value based on the temperature prediction variable value derived from the temperature prediction variable. Temperature compensation for current values is necessary because the temperature measurement speed using temperature sensors cannot keep up with the temperature rise speed. Temperature compensation is required to measure rapidly changing temperatures.

The battery state determination unit 280 has the function of determining an error according to the range of the difference value and diagnosing the battery's state according to the number of occurrences of the error. The battery state determination unit 280 may determine whether the battery's state is normal or abnormal based on the difference between the first current value and the second current value. For example, if the difference value between the first current value and the second current value, computed through linearity compensation and temperature compensation, exceeds a pre-set threshold value or occurs beyond a threshold number of times, it is highly likely that the battery is not in a normal state. Hereinafter, a battery monitoring method S100 performed by the battery monitoring device 10 will be described.

Figure 4:
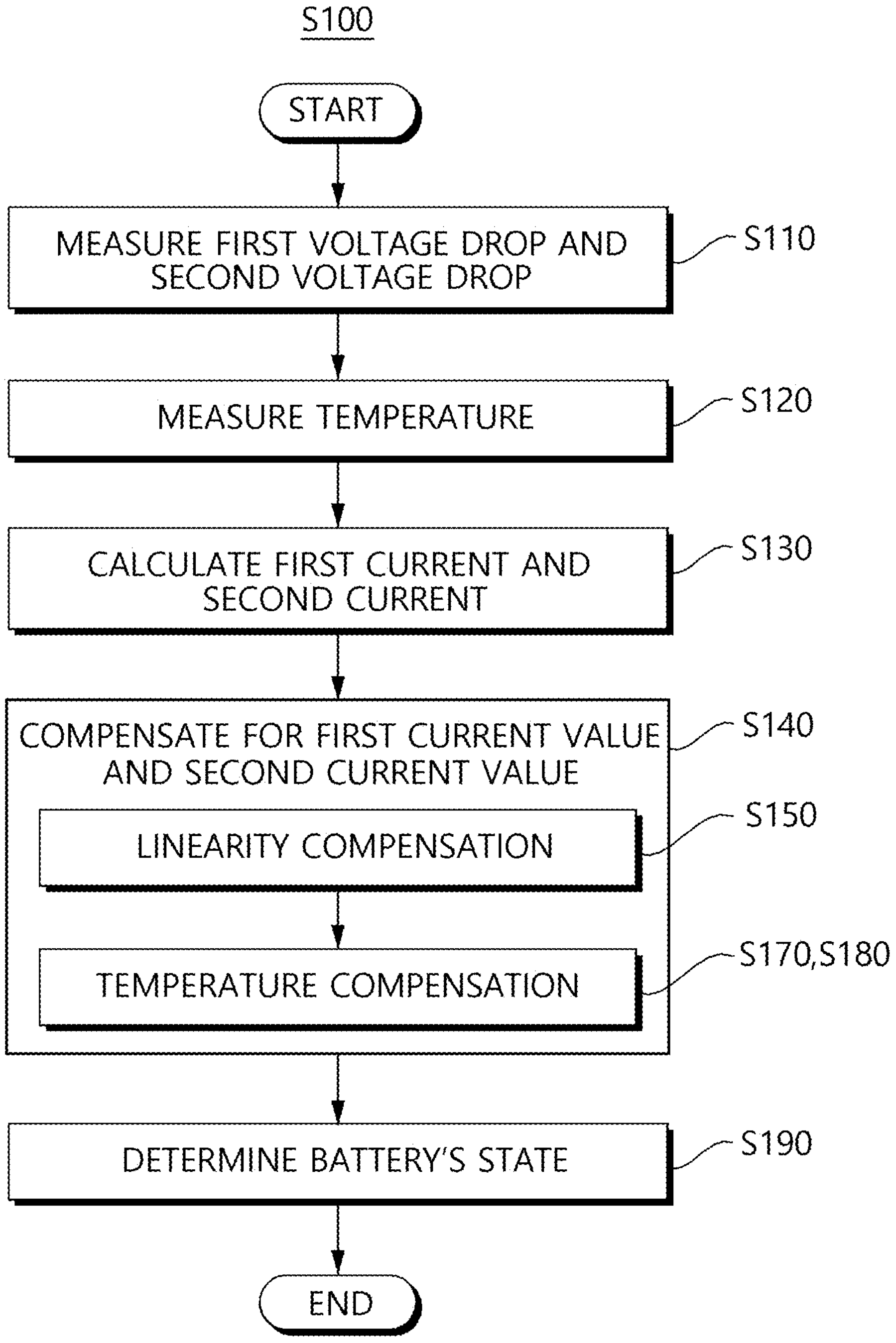
FIG. 4 is a flowchart illustrating a battery monitoring method according to an embodiment of the present invention.

FIG. 4 is a flowchart illustrating a battery monitoring method according to an embodiment of the present invention.

Referring to FIG. 4, a battery monitoring method S100 is configured to include voltage drop measurement S110, temperature measurement S120, current calculation S130, current value compensation S140, and battery state determination S190.

First, the battery monitoring device 10 may measure the first voltage drop across both ends of the first shunt resistor of the bus bar electrically connected to the battery and the second voltage drop across both ends of the second shunt resistor, which is in parallel or serial connection with the first shunt resistor (S110).

The battery monitoring device 10 may measure the temperature due to current using a temperature sensor 300 (S120).

The temperature sensor 300 may include a first temperature sensor 310 configured to measure the first temperature value of the bus bar and a second temperature sensor 320 configured to measure the second temperature value of the PCB where the bus bar 100 is installed, and The temperature measurement operation S120 may be configured to include applying a weight to each of the first and second temperature values. Since the current flowing through the shunt resistor 120 is influenced by both the temperature of the bus bar 100 and the temperature of the PCB connected to the bus bar 100, the weights applied to the first temperature value and the second temperature value may vary depending on the connection relationship, shape, and size of the bus bar 100 and the PCB.

Then, the battery monitoring device 10 may calculate the first current and the second current flowing, respectively, through a first shunt resistor 121 and a second shunt resistor 122 using the first voltage drop value and the second voltage drop value (S130). The calculation of current values is based on Ohm's law but may also use shunt resistor calibration data that includes discontinuity or inflection point information.

For example, the battery monitoring device 10 may convert the first voltage drop value and the second voltage drop value into digital values (S131), apply calibration data for the first shunt resistor and calibration data for the second shunt resistor to the first voltage drop value and the second voltage drop value, respectively, to calculate the first current and value the second current value (S132), and amplify the first current value and the second current value (S133).

Subsequently, the battery monitoring device 10 may perform various compensations for the first current value and the second current value (S140).

For example, the battery monitoring device 10 may perform linearity compensation for the first current value and the second current value using linearity data that includes a temperature value, inflection point information of the first current value and the second current value, amplification values of the first current value and the second current value, and a temperature prediction rise value due to current (S150).

The linearity compensation S150 is characterized by compensating for linearity for each current segment based on an inflection point according to the amplification factor of the first current and the second current.

Additionally, the battery monitoring device 10 may perform synchronization and temperature compensation for the rapidly changing first and second current values that change rapidly according to changes in temperature (S170 and S180).

For example, the battery monitoring device 10 may determine a temperature prediction variable according to the magnitudes of the first and second current values and the current application time, calculate a temperature prediction variable value based on the temperature prediction variable, and perform temperature compensation for the first current value and the second current value based on the temperature prediction variable value.

Finally, the battery monitoring device 10 may determine the battery's state based on the difference between the first current value and the second current value (S190)

Figure 5:
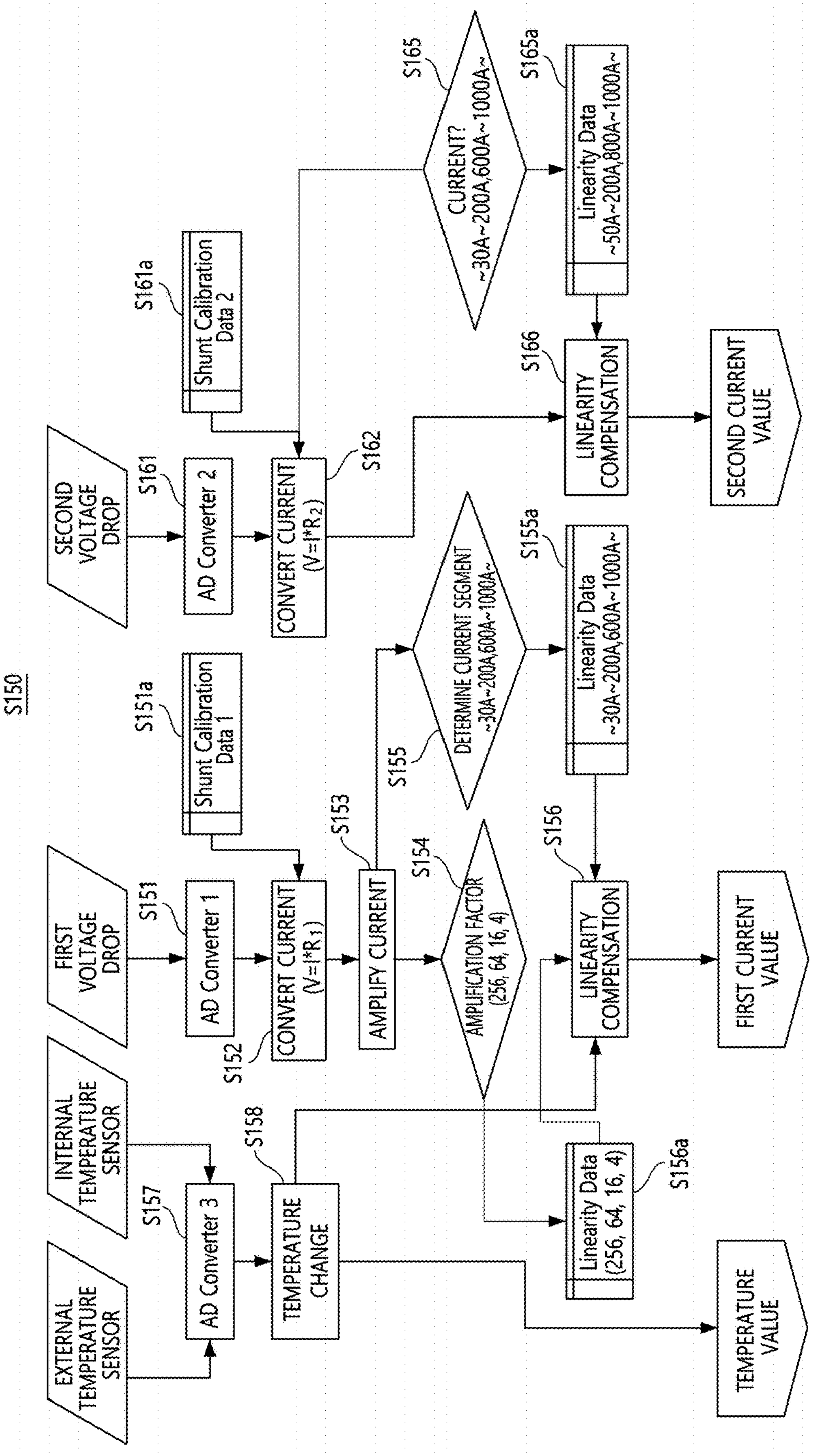
FIG. 5 is a detailed flowchart illustrating operation S150 of the method of FIG. 4.

FIG. 5 is a detailed flowchart illustrating operation S150 of the method of FIG. 4.

Referring to FIG. 5, the first voltage drop and the second voltage drop, measured by the voltage measurement unit 220, are converted into digital values (S151 and S161) and then converted into current values (S152 and S162). In this case, the first current value may be amplified through an amplifier (S153).

Next, linearity compensation for the first current value and the second current value is performed. The linearity compensation process may include determining amplification factors (256×, 64×, 16×, and 4×) according to the magnitude of the current value magnitude (S154) and determining current segments depicted in FIG. 6 (S155 and S165). Linearity compensation (S156 and S166) may involve using the temperature converted at S158 and may use linearity data (S156*a* and S165*a*). Through the linearity compensation, the first current value and the second current value are compensated into a new first current value and a new second current value.

The first temperature value collected through the internal sensor, i.e., the first temperature sensor 310, and the second temperature value collected through the external sensor, i.e., the second temperature sensor 320, are converted into digital values (S157) and then temperature is converted through the application of weights (S158).

Figure 6:
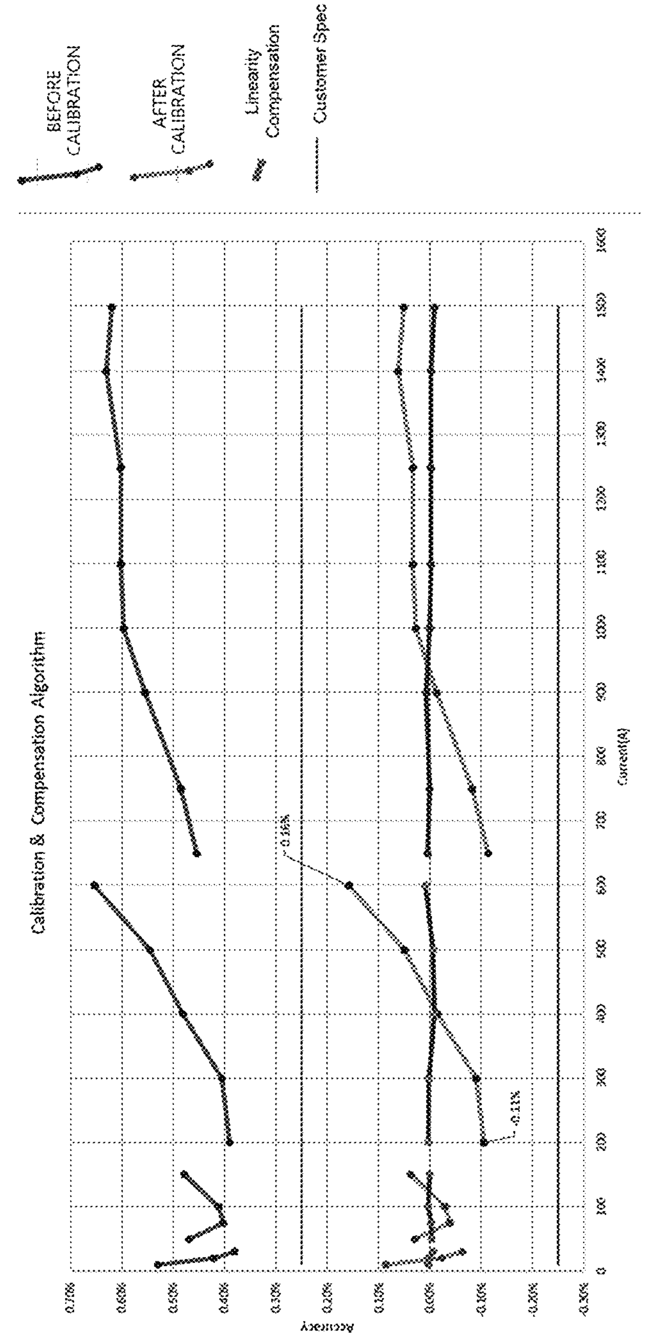
FIG. 6 is a graph showing an example of linearity compensation according to an embodiment of the present invention.

FIG. 6 is a graph showing an example of linearity compensation according to an embodiment of the present invention.

Referring to FIG. 6, a graph of before and after compensation by a linearity-related calibration and compensation algorithm is depicted. The error in a current value may be depicted as a discontinuous graph depending on the magnitude segment. For example, the error in the current value may be depicted in a total of four segments. Through linearity compensation, the graph is rearranged around the 0% error, which serves as the center for both positive and negative errors (yellow line). Ultimately, linearity compensation is performed such that the error range is close to 0% (green line). Here, "Linearity compensation" refers to the point where linearity compensation takes place, and "customer spec" refers to the required error range.

Figure 7:
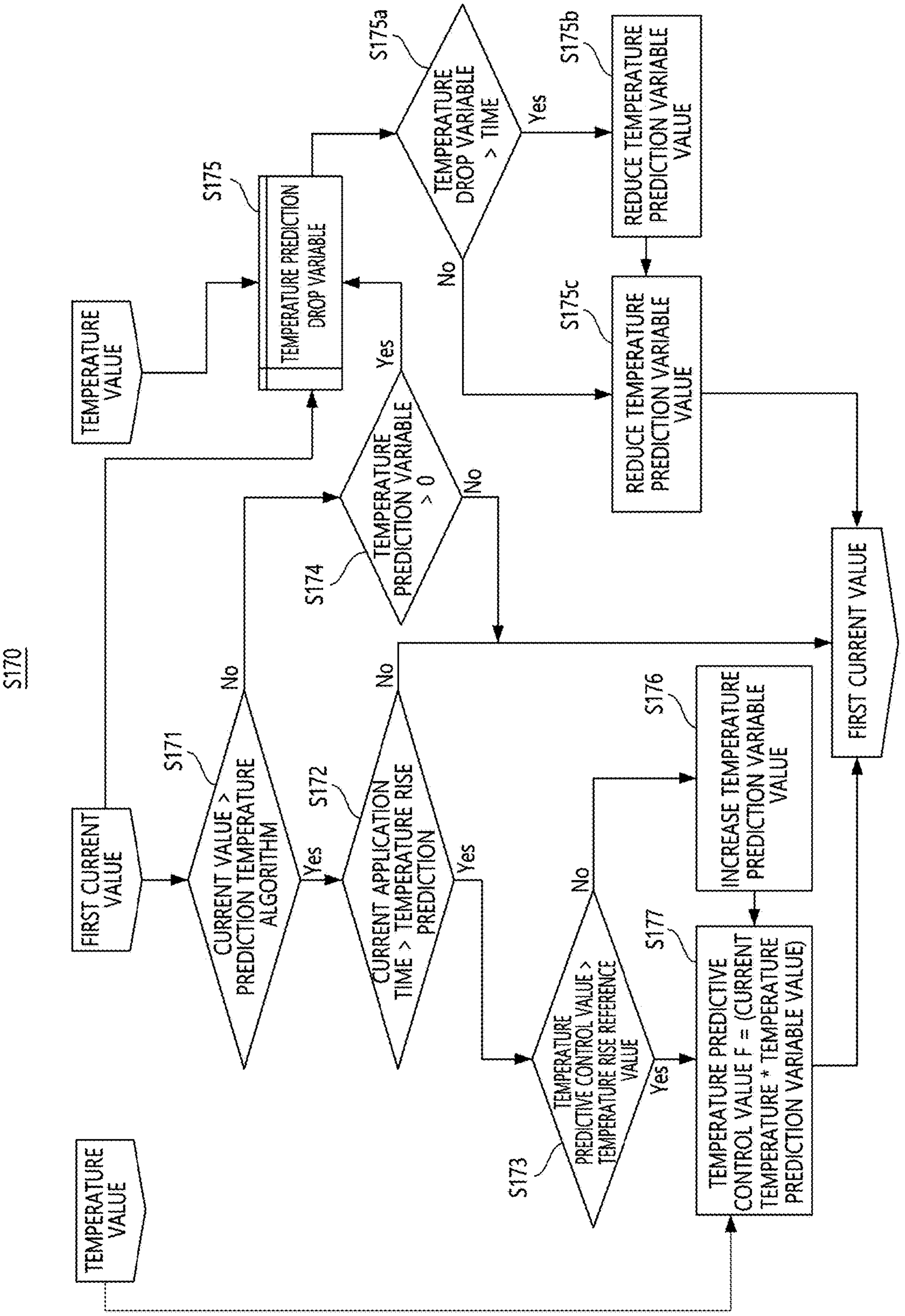
FIG. 7 is a detailed flowchart illustrating operation S170 of the method of FIG. 4.

FIG. 7 is a detailed flowchart illustrating operation S170 of the method of FIG. 4.

Figure 8:
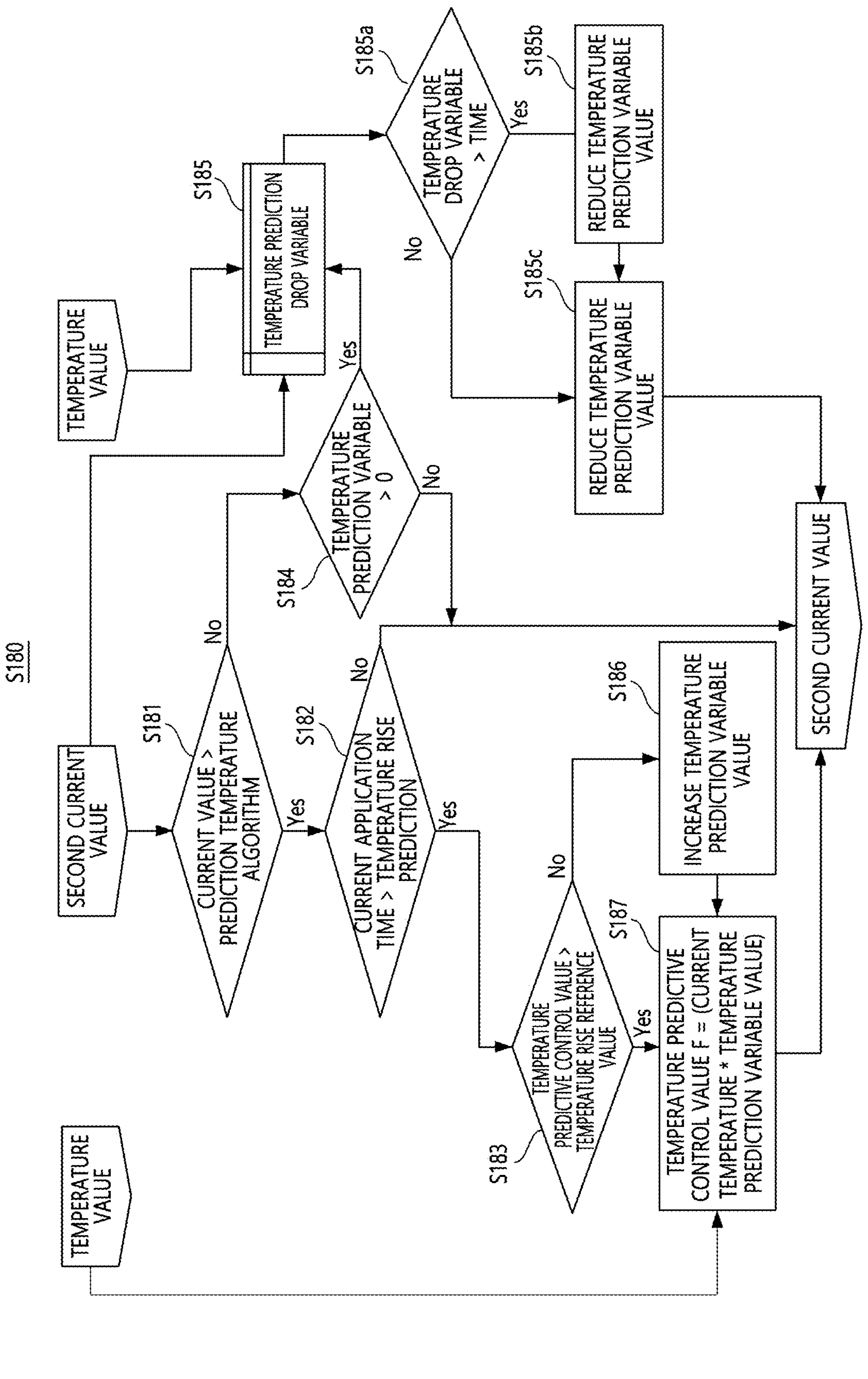
FIG. 8 is a detailed flowchart illustrating operation S170 of the method of FIG. 4.

FIG. 8 is a detailed flowchart illustrating operation S170 of the method of FIG. 4.

In FIG. 7, the temperature compensation process for the first current value is depicted, while FIG. 8 shows the temperature compensation process for the second current value. Since the temperature compensation process is commonly performed for both the first current and the second current, it will be described with reference to FIG. 7 as a representative example.

At S171, a process is performed to check if the measured current value falls within the current range in which the temperature sensor can respond. Referring to data before calibration in FIG. 10, it is observed that a deviation between the temperature sensor and the actual temperature occurs at currents exceeding approximately 300 A.

At S172, a current application time is checked because even when the current is applied consistently, the amount of error varies over time, so the temperature prediction value needs to change with time.

At S173, since the temperature prediction value is a function of current value and time, the process of setting a calibration limit for this and checking the temperature prediction value is performed. The temperature prediction value changes in real-time based on the current value and time.

S174 is a routine to proceed with the process of returning the predicted temperature to 0 if the current value is applied below the temperature prediction value.

S175*a* involves the speed adjustment for returning a predicted temperature control value based on the current value and the application time (time adjustment for the temperature sensor's value to match the actual temperature).

Because the accuracy varies depending on the current value and time, it is necessary for the temperature predictive control value to estimate the slope of the error value.

Figure 9:
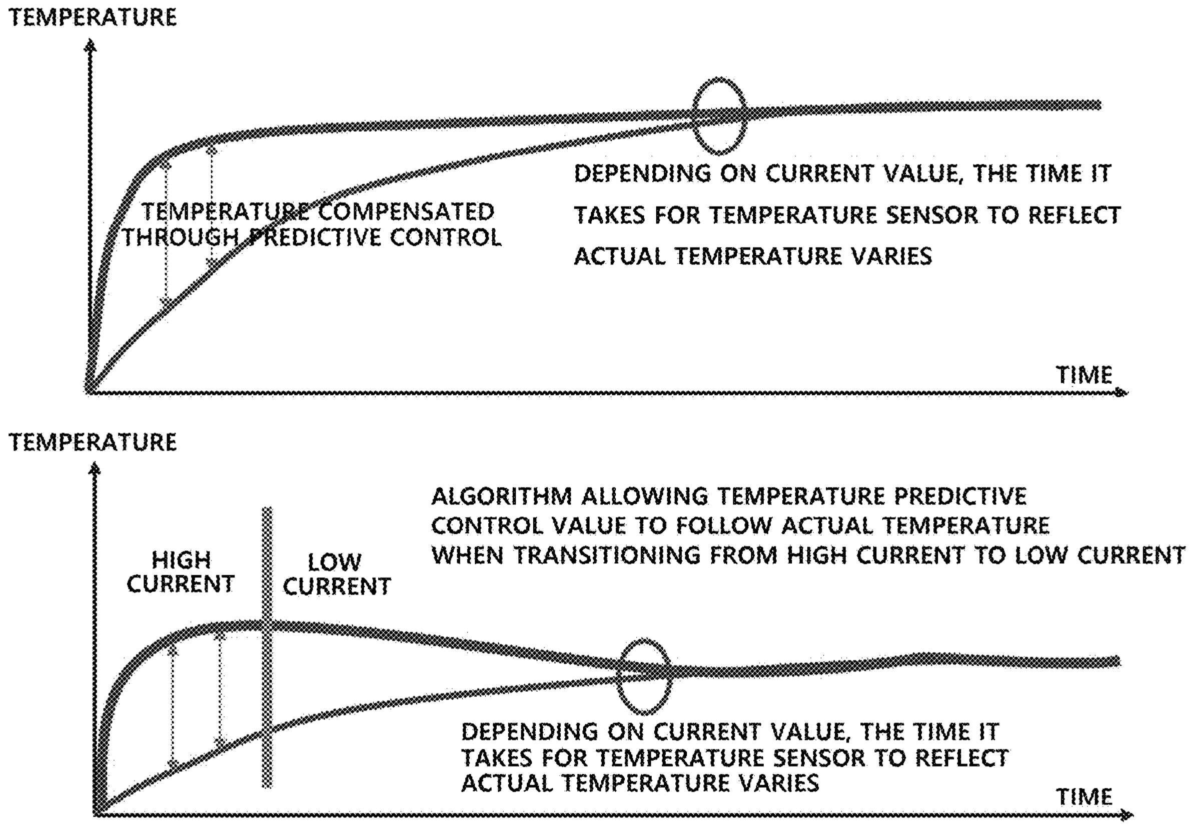
FIG. 9 illustrates graphs showing examples of temperature compensation according to an embodiment of the present invention.

FIG. 9 illustrates graphs showing examples of temperature compensation according to an embodiment of the present invention.

Referring to FIG. 9, temperature compensated through predictive control is illustrated. Depending on the current value, the time it takes for the temperature sensor to reflect the actual temperature may vary. Therefore, an algorithm that estimates the temperature predictive control value using the actual temperature when transitioning from high to low current may be used.

Figure 10:
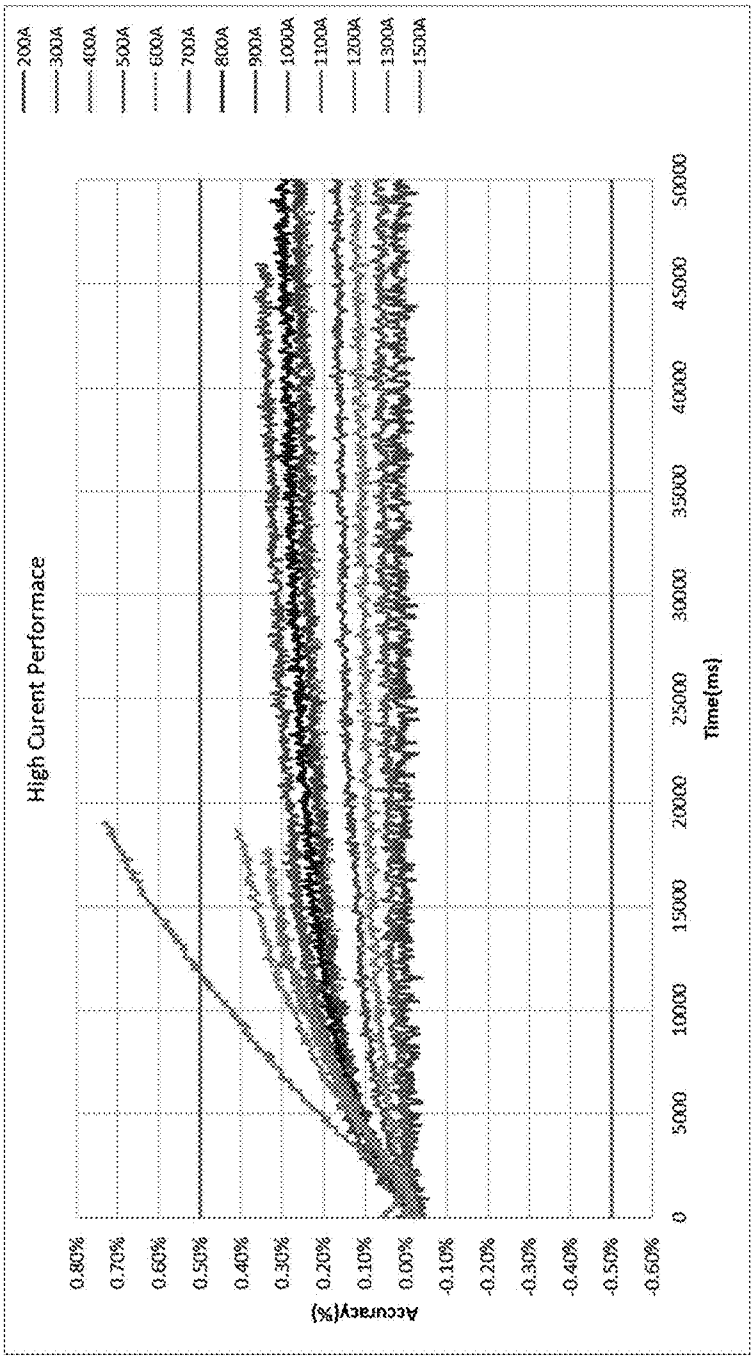
FIG. 10 is a graph showing data before temperature compensation according to an embodiment of the present invention.

FIG. 10 is a graph showing data before temperature compensation according to an embodiment of the present invention.

Figure 11:
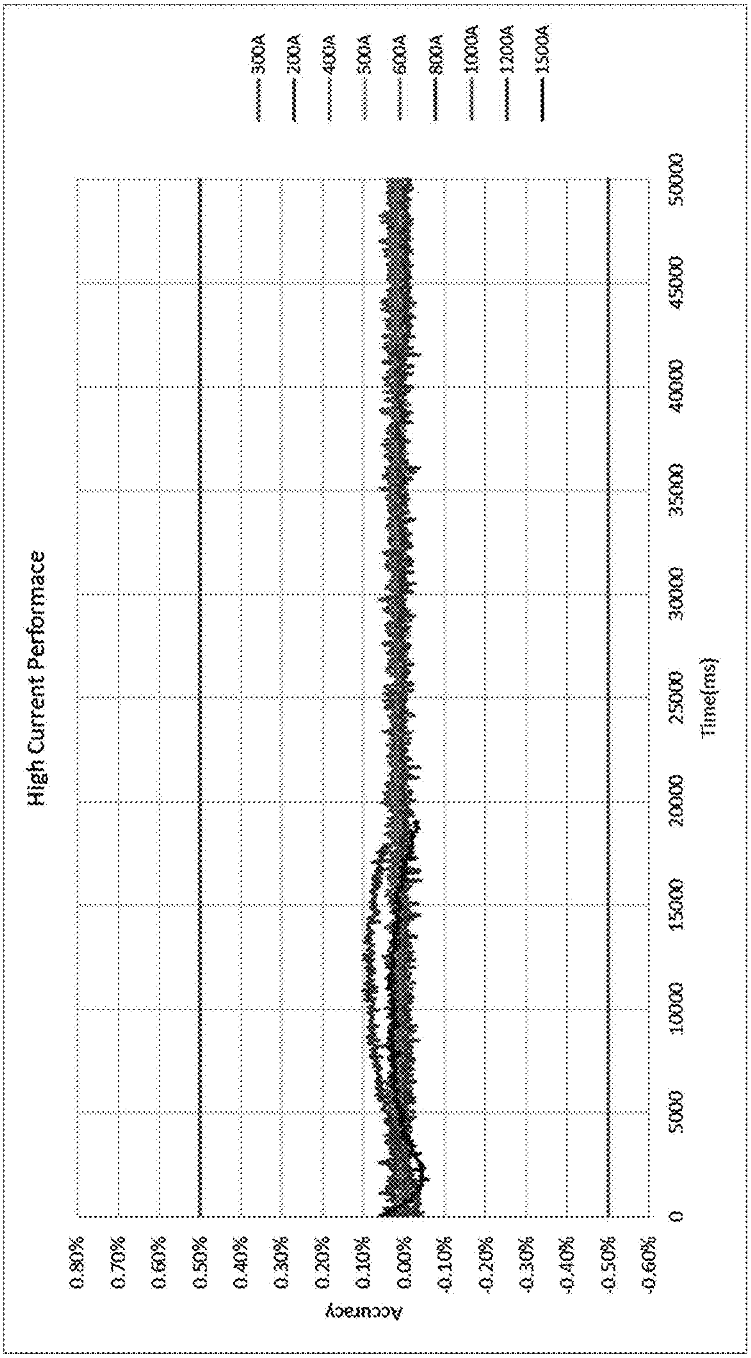
FIG. 11 is a graph showing data after temperature compensation according to an embodiment of the present invention.

FIG. 11 is a graph showing data after temperature compensation according to an embodiment of the present invention.

Referring to FIG. 10, in the graph of data before temperature compensation, it can be observed that the errors in the current values gradually increase over time. There are cases where the error in the current value exceeds an error range of 0.05%.

On the other hand, referring to FIG. 11, in the graph of data after temperature compensation, it can be seen that the errors in current values converge within a certain error range, for example, within the range of −0.10% to 0.10%.

Figure 12:
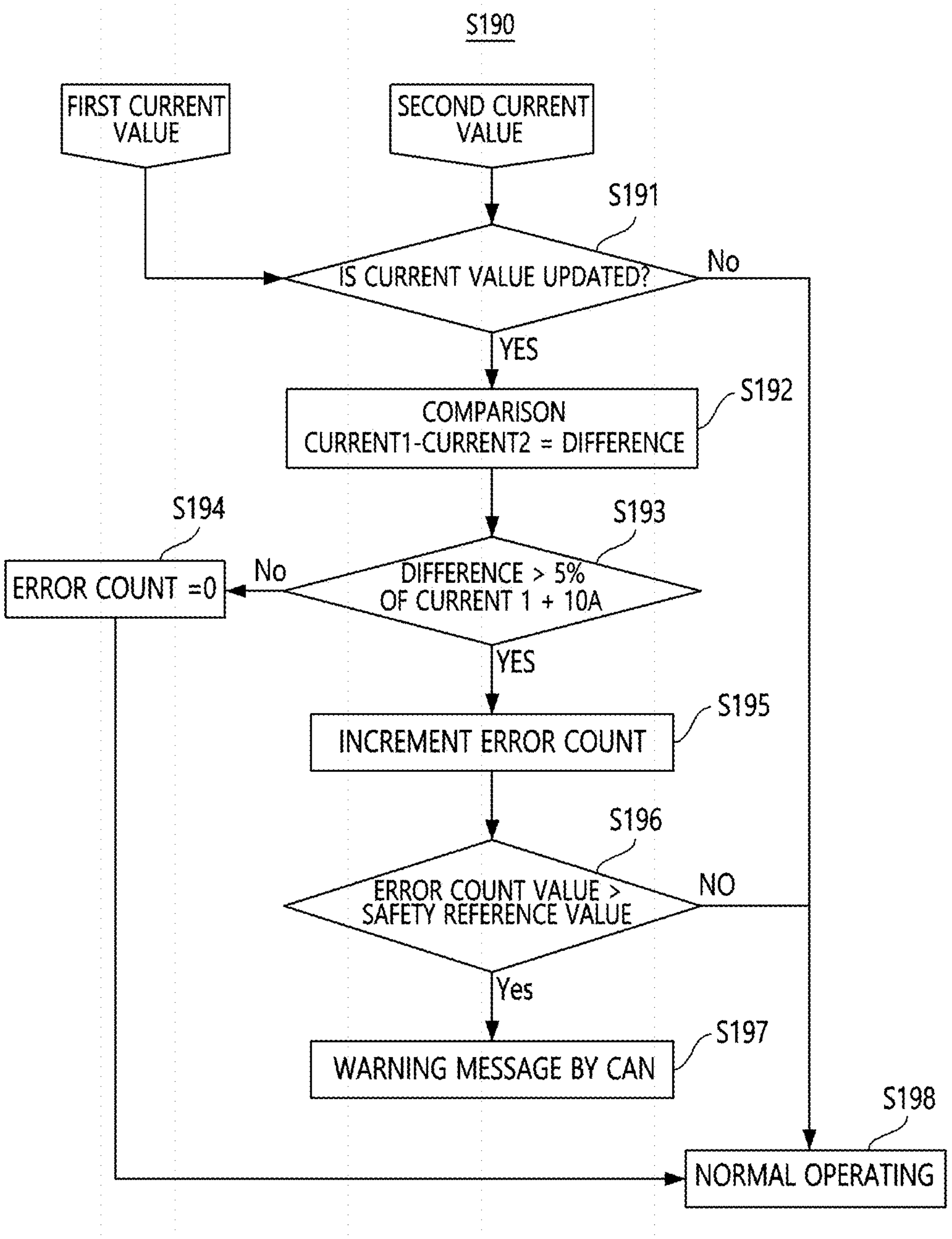
FIG. 12 is a detailed flowchart illustrating operation S190 of the method of FIG. 4.

FIG. 12 is a detailed flowchart illustrating operation S190 of the method of FIG. 4.

Referring to FIG. 12, the current values, derived from real-time measured voltage values, are updated (S191), the difference between the first current value and the second current value is calculated (S192), and the differences in current values are compared (S193). There may be cases where the difference in current values does not exceed the range of the threshold (S194). In cases where the difference in current values exceeds the range of the threshold, a count is incremented (S195). It is determined whether the count of differences in current values exceeding the threshold range falls outside a reference value (S196). If the count exceeds the reference value, a warning message is generated (S197). When the difference in current values does not exceed the threshold, the system is in a normal operating state (S198).

Figure 13:
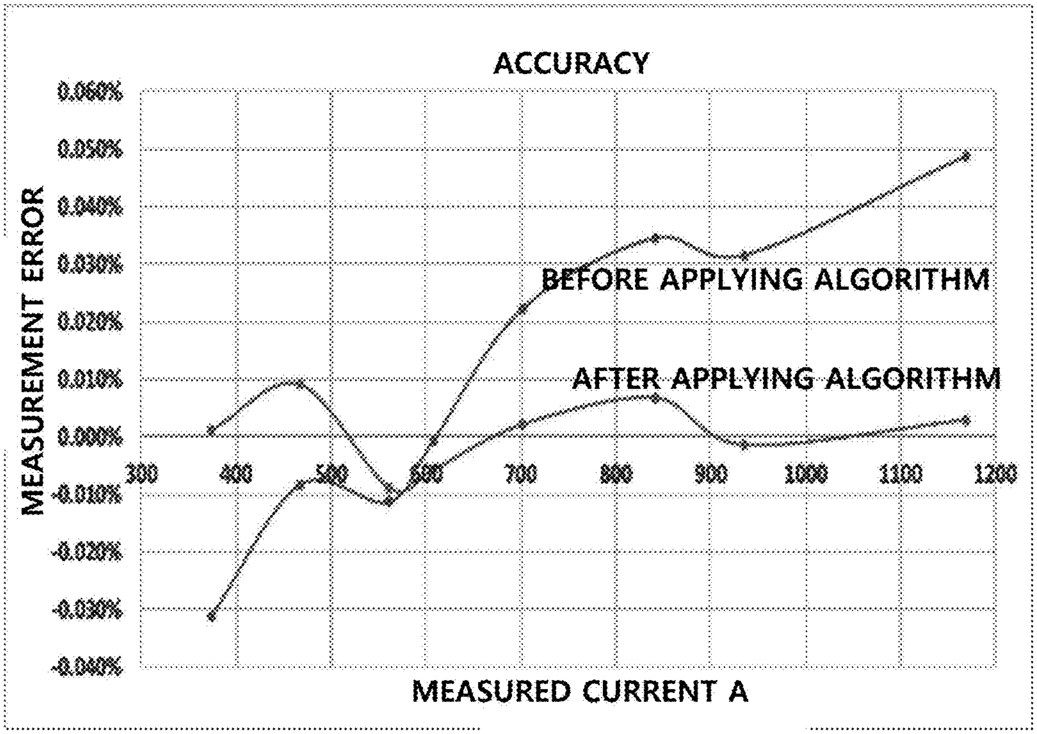
FIG. 13 is a graph showing a comparison of before and after compensation according to an embodiment of the present invention.

FIG. 13 is a graph showing a comparison of before and after compensation according to an embodiment of the present invention.

Referring to FIG. 13, the accuracy of the current value before compensation and the accuracy of the current value after compensation through linearity compensation and temperature compensation are depicted.

FIG. 14 is a table showing an example of the accuracy and linearity resulting from compensation according to an embodiment of the present invention.

Referring to FIG. 14, the error of 0.08% before calibration is reduced to 0.02% through the linearity compensation algorithm. In addition, the current accuracy of the first current value and the second current value before calibration is improved from −0.03 to 0.05% to −0.01 to 0.01%.

According to one embodiment of the present invention, it is possible to reduce the measurement error of the current value through linearity compensation and temperature compensation.

Additionally, utilizing current values that have undergone linearity compensation and temperature compensation may increase the reliability of monitoring information related to the battery's state.

As described above, although exemplary embodiments of the present invention have been described, various embodiments disclosed in "DETAILED DESCRIPTION OF THE INVENTION" are provided only for the illustrative purpose. Those skilled in the art can understand that various modifications, variations, and equivalents of the present invention are possible based on the above description.

In addition, since the present invention can be realized in various forms, the present invention is not limited to the above embodiments. The disclosed embodiments are provided so that this disclosure will be thorough and complete, and will fully convey the scope of the invention to those skilled in the art. The present invention is only defined within the scope of accompanying claims.

REFERENCE NUMERALS

10: BATTERY MONITORING DEVICE
100: BUS BAR
200: MEASUREMENT UNIT
210: CONTROL UNIT
220: VOLTAGE MEASUREMENT UNIT
230: CURRENT CALCULATION UNIT
240: TEMPERATURE MEASUREMENT UNIT
250: CURRENT COMPENSATION UNIT
260: LINEARITY COMPENSATION UNIT
270: TEMPERATURE COMPENSATION UNIT
280: BATTERY STATE DETERMINATION UNIT
310: FIRST TEMPERATURE SENSOR
320: SECOND TEMPERATURE SENSOR

What is claimed is:

1. A battery monitoring method, which is performed by a battery monitoring device, comprising:

measuring a first voltage drop across both ends of a first shunt resistor of a bus bar electrically connected to a battery and a second voltage drop across both ends of a second shunt resistor, which is in parallel or serial connection with the first shunt resistor;

calculating a first current and a second current flowing, respectively, through the first shunt resistor and the second shunt resistor using a first voltage drop value and a second voltage drop value;

determining a state of the battery using a difference between a first current value and a second current value;

measuring a temperature due to current using a temperature sensor, wherein the temperature sensor comprises an internal temperature sensor configured to measure a first temperature value of the bus bar and an external temperature sensor configured to measure a second temperature value of a printed circuit board (PCB) where the bus bar is installed, and wherein measuring the temperature comprises applying a weight to each of the first temperature value and the second temperature value, and performing linearity compensation for the first current value and the second current value using linearity data that includes a temperature value, inflection point information of the first current value and the second current value, amplification values of the first current value and the second current value, and a temperature prediction rise value due to current.

2. The battery monitoring method of claim 1, wherein the calculating of the first current and the second current comprises:

converting the first voltage drop value and the second voltage drop value into digital values;

calculating the first current value and the second current value by applying calibration data for the first shunt resistor and calibration data for the second shunt resistor to the first voltage drop value and the second voltage drop value, respectively; and amplifying the first current value and the second current value.

3. The battery monitoring method of claim 1, wherein the performing of the linearity compensation comprises compensating for linearity for each current segment based on an inflection point according to an amplification factor of the first current and the second current.

4. The battery monitoring method of claim 1, further comprising performing synchronization and temperature compensation for the first and second current values that change rapidly according to changes in temperature.

5. The battery monitoring method of claim 4, wherein the performing of the synchronization and temperature compensation comprises determining a temperature prediction variable according to the magnitudes of the first and second current values and the current application time;

calculating a temperature prediction variable value based on the temperature prediction variable; and performing temperature compensation for the first current value and the second current value using the temperature prediction variable value.

* * * * *